(12) United States Patent
Moon et al.

(10) Patent No.: US 9,605,810 B2
(45) Date of Patent: Mar. 28, 2017

(54) LIGHT EMITTING DEVICE PACKAGE AND LIGHTING APPARATUS USING THE SAME

(71) Applicant: LG ELECTRONICS INC., Seoul (KR)

(72) Inventors: Euna Moon, Seoul (KR); Bongho Kim, Seoul (KR); Sangcheol Lee, Seoul (KR); Dohyung Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 131 days.

(21) Appl. No.: 14/019,586

(22) Filed: Sep. 6, 2013

(65) Prior Publication Data

US 2014/0353695 A1 Dec. 4, 2014

(30) Foreign Application Priority Data

Jun. 3, 2013 (KR) .......... 10-2013-0063392
Jun. 3, 2013 (KR) .......... 10-2013-0063393

(51) Int. Cl.
| | | |
|---|---|---|
| H01L 33/50 | (2010.01) | |
| H01L 25/075 | (2006.01) | |
| F21V 3/04 | (2006.01) | |
| F21V 29/70 | (2015.01) | |
| F21Y 101/00 | (2016.01) | |

(52) U.S. Cl.
CPC ............ F21K 9/232 (2016.08); *F21V 3/0445* (2013.01); *F21V 29/70* (2015.01); *F21Y 2101/00* (2013.01); *H01L 25/0753* (2013.01); *H01L 33/507* (2013.01); *H01L 2924/0002* (2013.01)

(58) Field of Classification Search
CPC ..... H01L 33/50; H01L 33/501; H01L 33/502; H01L 33/504; H01L 33/508; H01L 33/507; H01L 25/0753; F21K 9/135; F21V 3/0445; F21V 29/70; F21Y 2101/02
See application file for complete search history.

(56) References Cited

U.S. PATENT DOCUMENTS

| | | | |
|---|---|---|---|
| 2008/0211386 A1* | 9/2008 | Choi et al. ................. 313/503 |
| 2009/0262515 A1* | 10/2009 | Lee et al. .................... 362/84 |
| 2010/0061078 A1* | 3/2010 | Kim .................... H01L 33/50 |
| | | | 362/84 |
| 2010/0264432 A1* | 10/2010 | Liu et al. ..................... 257/89 |
| 2011/0080740 A1* | 4/2011 | Allen et al. ................. 362/294 |
| 2011/0228514 A1* | 9/2011 | Tong et al. .................. 362/84 |
| 2011/0286210 A1* | 11/2011 | Shiue et al. ................ 362/231 |

(Continued)

*Primary Examiner* — Joshua King
*Assistant Examiner* — Mohammed R Alam
(74) *Attorney, Agent, or Firm* — Ked & Associates, LLP

(57) ABSTRACT

Disclosed is a light emitting device, and more particularly are a light emitting device package configured to improve the quality of light and a lighting apparatus using the same. The light emitting device package includes a light emitting device located on a package main body, the light emitting device including a first light emitting device configured to emit light having a first wavelength band and a second light emitting device configured to emit light having a second wavelength band, a lens disposed over the light emitting device, and a wavelength conversion layer disposed over the lens, the wavelength conversion layer serving to absorb light having the first wavelength band or the second wavelength band so as to emit light having a third wavelength band.

20 Claims, 11 Drawing Sheets

(56) References Cited

U.S. PATENT DOCUMENTS

2013/0240926 A1* 9/2013 Sun ................. H01L 33/505
257/98
2014/0264409 A1* 9/2014 Ashdown ............ H01L 33/504
257/98

* cited by examiner

LIGHT EMITTING DEVICE PACKAGE AND LIGHTING APPARATUS USING THE SAME

This application claims the benefit of Korean Patent Application No. 10-2013-0063392, filed on Jun. 3, 2013 and Korean Patent Application No. 10-2013-0063393, filed on Jun. 3, 2013, which are hereby incorporated by reference as if fully set forth herein.

BACKGROUND OF THE DISCLOSURE

Field of the Disclosure

The present invention relates to a light emitting device, and more particularly to a light emitting device package configured to improve the quality of light and a lighting apparatus using the same.

Discussion of the Related Art

Light sources, light emitting methods, driving methods, etc. with regard to lighting appliances have been studied, and in recent years, light emitting devices advantageous in terms of efficiency, color diversity, autonomous design, etc. have received attention as a light source of a lighting appliance.

In particular, Light Emitting Diodes (LEDs) are configured to generate light by exciting electrons across a band gap between a conduction band and a valence band of a semiconductor active (light emitting) layer. Electronic transition causes generation of light having a wavelength depending on the size of the band gap. Accordingly, color (wavelength) of light emitted by light emitting diodes varies according to semiconductor materials of an active layer of light emitting diodes.

Meanwhile, color reproduction is measured using a Color Rendering Index (CRI, Ra). The CRI (Ra) is a corrected average value of relative measurement values with regard to color rendition of a lighting system as compared to color rendition of a reference radiator when the lighting system emits light of eight reference colors. That is, this refers to relative shift measurement on a surface color of a subject when a specific lamp emits light.

Light perceived as white is basically a mixture of two or more colors (wavelengths) of light. A single light emitting diode junction configured to generate white light has not yet been developed.

In one example, a white light emitting diode package includes a light emitting diode pixel/cluster of red, green, and blue light emitting diodes, and generates light perceived as white via mixing of red light, green light, and blue light.

In another example, a white light emitting diode package includes a light emitting diode configured to generate green light, and a light emitting material, for example, a fluorescent material, to emit yellow light when excited by light emitted from the light emitting diode. Light perceived as white is generated via mixing of blue light and yellow light.

The above references are incorporated by reference herein where appropriate for appropriate teachings of additional or alternative details, features and/or technical background.

SUMMARY OF THE DISCLOSURE

Accordingly, the present invention is directed to a light emitting device package and a lighting apparatus using the same that substantially obviate one or more problems due to limitations and disadvantages of the related art.

One object of the present invention is to provide a light emitting device package with improved light uniformity and efficiency and a lighting apparatus using the same.

Another object of the present invention is to provide a light emitting device package with improved color rendition and a lighting apparatus using the same.

A further object of the present invention is to provide a light emitting device package with improved light output and a lighting apparatus using the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a light emitting device package includes a light emitting device located on a package main body, the light emitting device including a first light emitting device configured to emit light having a first wavelength band and a second light emitting device configured to emit light having a second wavelength band, a lens disposed over the light emitting device, and a wavelength conversion layer disposed over the lens, the wavelength conversion layer serving to absorb light having the first wavelength band or the second wavelength band so as to emit light having a third wavelength band.

In accordance with another aspect of the invention, a light emitting device package includes a light emitting device located on a package main body, the light emitting device including a first light emitting device configured to emit light having a first wavelength band and a second light emitting device configured to emit light having a second wavelength band, a lens disposed over the light emitting device, a wavelength conversion layer disposed over the lens, the wavelength conversion layer serving to absorb light having the first wavelength band or the second wavelength band to emit light having a third wavelength band, and a first reflecting layer outwardly spaced apart from the wavelength conversion layer, the first reflecting layer serving to reflect light emitted from the light emitting device and the wavelength conversion layer so as to outwardly emit light from the package.

In accordance with a further aspect of the invention, a lighting apparatus includes a substrate, and a light emitting unit mounted on the substrate, the light emitting unit including a light emitting device located on a package main body, the light emitting device including a first light emitting device configured to emit light having a first wavelength band and a second light emitting device configured to emit light having a second wavelength band, a lens disposed over the light emitting device, and a wavelength conversion layer disposed over the lens, the wavelength conversion layer serving to absorb light having the first wavelength band or the second wavelength band so as to emit light having a third wavelength band.

It is to be understood that both the foregoing general description and the following detailed description of the present invention are exemplary and explanatory and are intended to provide further explanation of the invention as claimed.

BRIEF DESCRIPTION OF THE DRAWINGS

The embodiments will be described in detail with reference to the following drawings in which like reference numerals refer to like elements wherein.

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF SPECIFIC EMBODIMENTS

Figure 1:
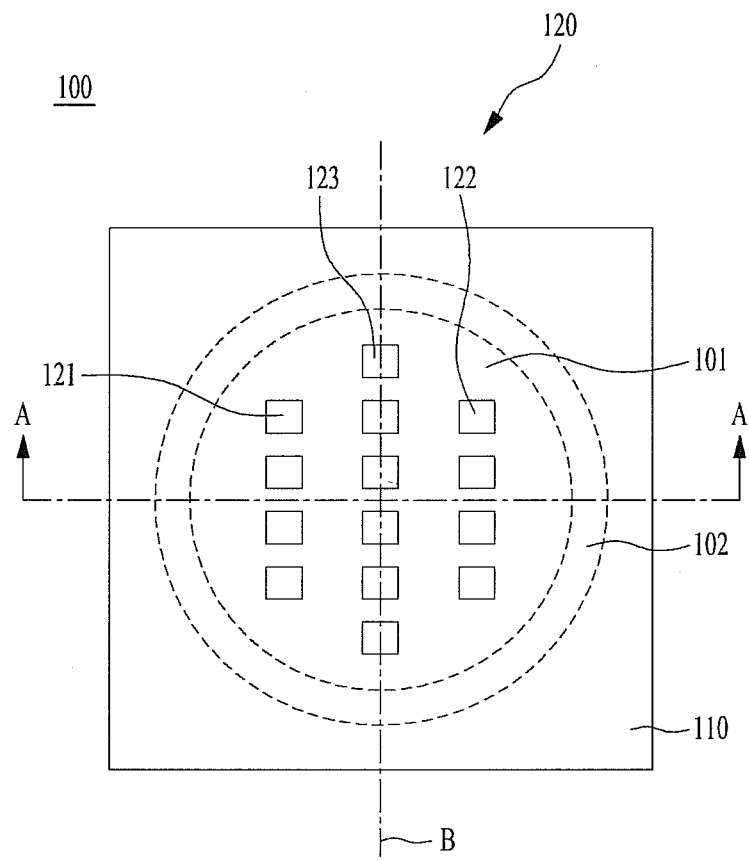
FIG. 1 is a plan view showing a first embodiment of a light emitting device package.

Hereinafter, exemplary embodiments of the present invention will be described in detail with reference to the accompanying drawings.

The present invention may be embodied in many alternate forms and should not be construed as limited to the embodiments set forth herein. Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims.

It will be understood that, when an element such as a layer, region or substrate is referred to as being "on" another element, it can be directly on the other element or intervening elements may also be present.

It will be understood that, although the terms first, second, etc. may be used herein to describe various elements, components, regions, layers and/or sections, these elements, components, regions, layers and/or sections should not be limited by these terms.

Figure 2:
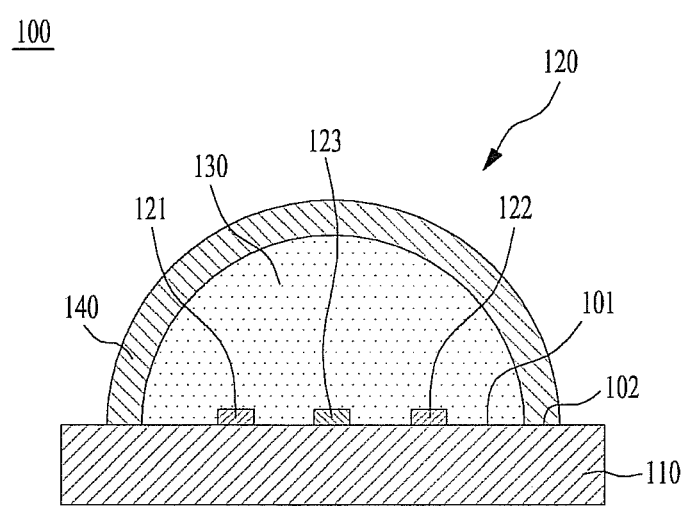
FIG. 2 is a sectional view taken along the line A-A of FIG. 1.

FIG. 1 is a schematic plan view showing one embodiment of a light emitting device package, and FIG. 2 is a sectional view taken along the line A-A of FIG. 1.

As exemplarily shown in FIGS. 1 and 2, the light emitting device package 100 includes a package main body 110 and a light emitting device 120 mounted on the package main body 110.

The package main body 110 may be formed of any one of ceramic, semiconductor, and metal, or combinations thereof.

In particular, if the package main body 110 is formed of semiconductor and metal, superior heat radiation may be accomplished. That is, effective radiation of heat from the light emitting device 120 may be accomplished.

The package main body 110 may have a mounting recess (see FIG. 9) in which the light emitting device 120 may be mounted. Although the mounting recess is not shown in detail, the mounting recess may be indented in a first region 101 of the package main body 110 where a lens 130 is located.

A second region 102, where a wavelength conversion layer 140 is located, may be provided around the first region 101 where the lens 130 is located. That is, the wavelength conversion layer 140 may be attached to the lens 130 as well as the second region 102 of the package main body 110.

A reflecting layer (210, see FIG. 9) may be provided around the mounting recess or the package main body 110 to enhance extraction efficiency of light from the light emitting device 120. This will be described later.

The package main body 110 may be provided with a lead (not shown), which is electrically coupled to the light emitting device 120 to thereby be connected to an external power source. Hereinafter, a description of details of the package main body 110 will be omitted.

The light emitting device 120 may include first light emitting devices 121 and 122 configured to emit light having a first wavelength band and a second light emitting device 123 configured to emit light having a second wavelength band.

Here, each of the first light emitting devices 121 and 122 and the second light emitting device 123 may include a plurality of light emitting devices that emit light having substantially the same wavelength band.

The lens 130 may be located over the light emitting device 120 to condense light emitted from the light emitting device 120.

The lens 130 may serve to protect and seal the light emitting device 120. The lens 130 may be formed of light transmissive resin. One example of the light transmissive resin may include epoxy based resin or silicone based resin.

As shown, the light emitting device 120 and the lens 130 may be located symmetrically to each other, which may ensure effective extraction of light emitted from the light emitting device 120.

The lens 130 may be formed over the light emitting device 120 via direct material injection. As occasion demands, the lens 130 may be attached to the light emitting device 120.

As exemplarily shown in FIG. 2, the lens 300 may be a spherical lens having a curvilinear outer surface. However, the disclosure is not limited thereto, and a non-spherical lens, such as a parabolic lens, an elliptical lens, etc., may be used as occasion demands.

The wavelength conversion layer 140 may be provided over the lens 130 to absorb light emitted from the light emitting device 120 and emit light having a specific wavelength band.

The wavelength conversion layer 140 may have a constant thickness over the lens 130. That is, the wavelength conversion layer 140 may come into contact with the lens 130 such that an outer surface of the wavelength conversion layer 140 has the same curvature as the lens 130.

In this case, the thickness of the wavelength conversion layer 140 may be less than the thickness of the lens 130.

The wavelength conversion layer 140 may be a layer in which a fluorescent material (or a phosphor material) is uniformly distributed.

The fluorescent (phosphor) material may be a silicate based material, a sulfide based material, a nitride based material, or mixtures thereof. However, the disclosure is not limited thereto, and any other materials may be used so long as they emit light having the aforementioned wavelength band when excited by the light emitting device 120.

As such, the wavelength conversion layer 140 is spaced apart from the light emitting device 120 at least by the thickness of the lens 130, rather than coming into contact with the light emitting device 120.

The wavelength conversion layer 140 may have a sufficiently great area to cover the entire luminous flux of the light emitting device 120, and thus achieve high efficiency light conversion and light output.

Accordingly, as light emitted from the first light emitting devices 121 and 122 and light emitted from the second light emitting device 123 pass through the wavelength conversion layer 140, the light is uniformly mixed with light converted by the wavelength conversion layer 140, which ensures acquisition of a uniform intensity of light regardless of angles.

Moreover, since light efficiency of a fluorescent (phosphor) material is reduced by heat, positioning the fluorescent (phosphor) material at a distance from the light emitting device 120 that serves as a heat source may attenuate efficiency reduction due to heat.

Meanwhile, the first wavelength band that is a wavelength of light emitted from the first light emitting devices 121 and 122 may be a blue light band, and the second wavelength band that is a wavelength of light emitted from the second light emitting device 120 may be a red light band.

A light emitting layer that emits blue light may be a gallium nitride (GaN) based material. In addition, a light emitting layer that emits red light may be a GaP:ZnO, GaAsP, or GaAlAs based material.

In this case, the wavelength conversion layer 140 may absorb light emitted from the light emitting device 120 to thereby output yellow light. As the yellow light is mixed with blue light of the first light emitting devices 121 and 122, white light may be produced.

The second light emitting device 123 that emits red light may be used to enhance color rendition of output light.

A half bandwidth of the spectrum of a red light emitting device is less than a half bandwidth of the spectrum of a red fluorescent (phosphor) material. Therefore, the red light emitting device may acquire output of light having high accurate color rendition and high efficiency because it contains a small long wavelength region that does not greatly contribute to light output.

As mentioned above, the first light emitting devices 121 and 122 and the second light emitting device 123 may respectively include a plurality of light emitting devices that emit light having substantially the same wavelength band. In this case, the first light emitting devices 121 and 122 and the second light emitting device 123 may be located symmetrically to each other. This serves to enhance color uniformity under the condition of a symmetrical relationship between blue light and red light.

In one example, the first light emitting devices 121 and 122 may be located symmetrically to the second light emitting device 123.

More specifically, as exemplarily shown in FIG. 1, the second light emitting device 123 may be located along a center line B of the package main body 110, and the first and second light emitting devices 121 and 122 may be located at opposite sides of the second light emitting device 123.

That is, the first light emitting devices 121 and 122 may be mounted at symmetrical positions about the line B.

Meanwhile, a main output wavelength of the wavelength conversion layer 140 may be 555 nm that exhibits superior visibility. Substantially, the main output peak may have a margin of 30 nm (±15 nm) from 555 nm.

Light emitted from the first light emitting devices 121 and 122 may have a main wavelength in a range of 445 nm to 465 nm. More advantageously, a main wavelength of the first wavelength band of blue light may be 450 nm.

Light emitted from the second light emitting device 123 may have a main wavelength in a range of 580 nm to 630 nm. More advantageously, a main wavelength of the second wavelength band of red light may be 615 nm.

In this case, blue light may have a margin of 20 nm (±10 nm) from 450 nm, and red light may have a margin of 30 nm (±15 nm) from 615 nm.

Upon driving of the above-described light emitting device package 100, the first light emitting devices 121 and 122 and the second light emitting device 123 may be connected parallel to each other, and current to be applied to the respective light emitting devices 121, 122 and 123 may be individually controlled.

The first light emitting devices 121 and 122, which emit the same color light, may be connected to each other in series.

In this case, mixed light emitted outward from the light emitting device package 100 may have remarkably enhanced color rendition.

Figure 3:
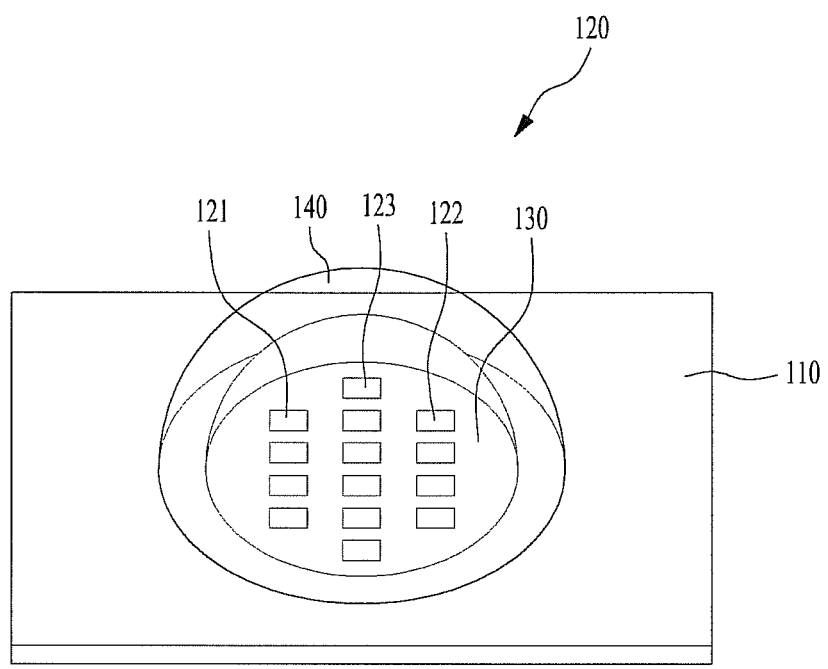
FIG. 3 is a perspective view showing the first embodiment of the light emitting device package.
Figure 4:
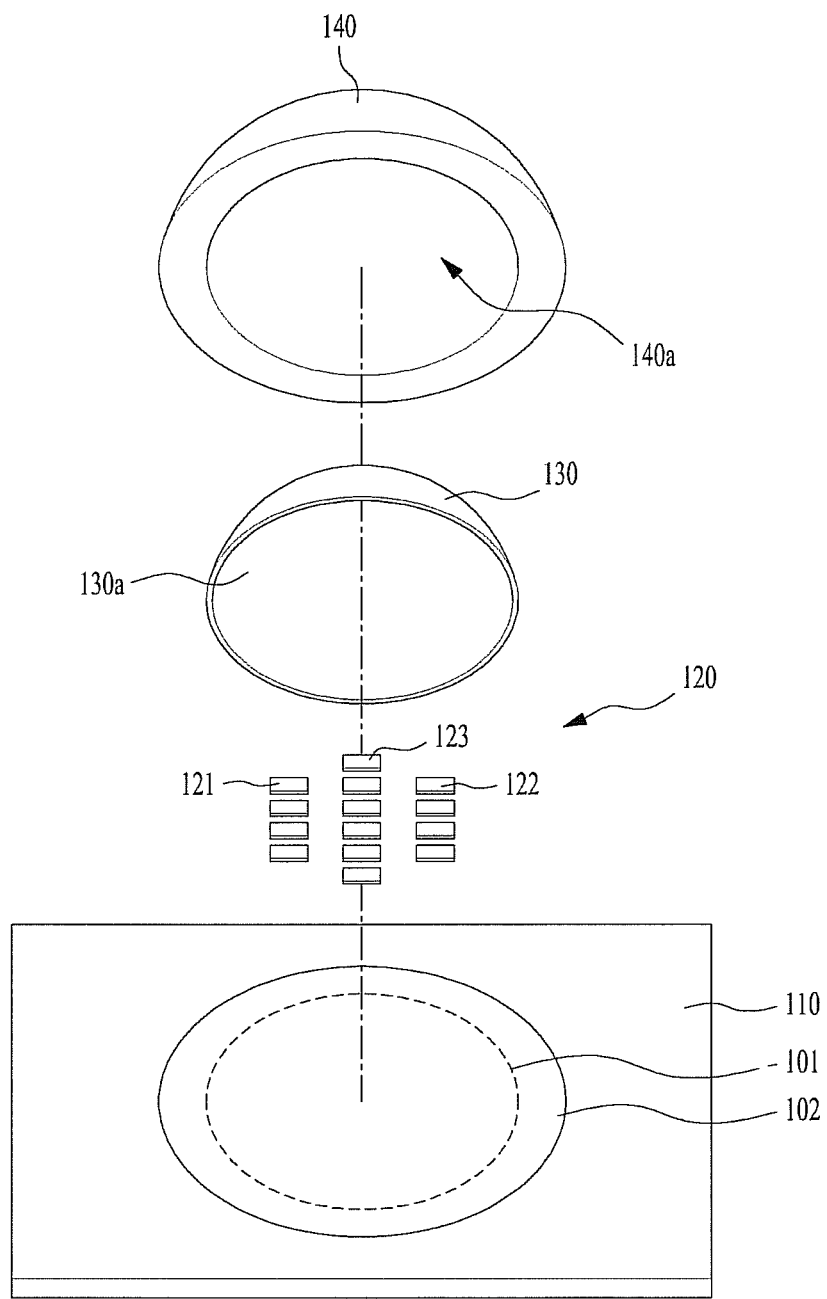
FIG. 4 is an exploded perspective view showing the first embodiment of the light emitting device package.

FIG. 3 is a perspective view showing the light emitting device package, and FIG. 4 is an exploded perspective view of the light emitting device package.

As exemplarily shown, the first light emitting devices 121 and 122 and the second light emitting device 123, which are located symmetrically to each other, may ensure that light having passed through the lens 130 is extracted outward while exhibiting uniform distribution.

The lens 130 is coupled to the light emitting device 120 such that the center axis of the lens 130 is located symmetrically to the light emitting device 120 to the maximum extent. In this case, the light emitting device 120 may be embedded in or come into contact with a lower surface 130a of the lens 130.

The outer surface of the lens 130 may accurately coincide with a recess 140a located in the wavelength conversion layer 140.

Output light of the light emitting device 120 having passed through the lens 130 is partially converted in wavelength while passing through the wavelength conversion layer 140 that is formed over the lens 130 by a constant thickness to cover the lens 130, which may ensure uniform mixing of light.

That is, as mentioned above, a part of blue light emitted from the first light emitting devices 121 and 122 is converted into yellow light while passing through the wavelength conversion layer 140.

In this case, the first light emitting devices 121 and 122 are located symmetrically about the lens 130 and an adjacent surface of the wavelength conversion layer 140, which ensures a constant conversion rate of blue light without a great deviation depending on a position of the wavelength conversion layer 140.

Most red light emitted from the second light emitting device 123 directly passes through the lens 130 and the wavelength conversion layer 140.

As such, blue light, converted yellow light, and red light may be uniformly mixed to generate high quality white light. In this case, red light may greatly enhance color rendition of white light.

Figure 5:
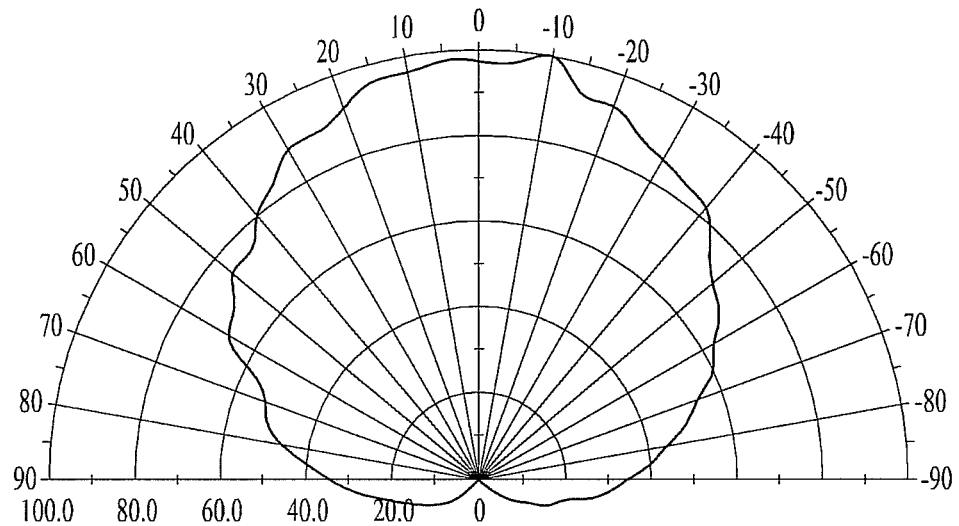
FIG. 5 is a graph showing light distribution of the light emitting device package according to the first embodiment.

The resulting white light may have light distribution as exemplarily shown in FIG. 5. That is, light emitted from the light emitting device package 100 may have Lambertian distribution.

Figure 6:
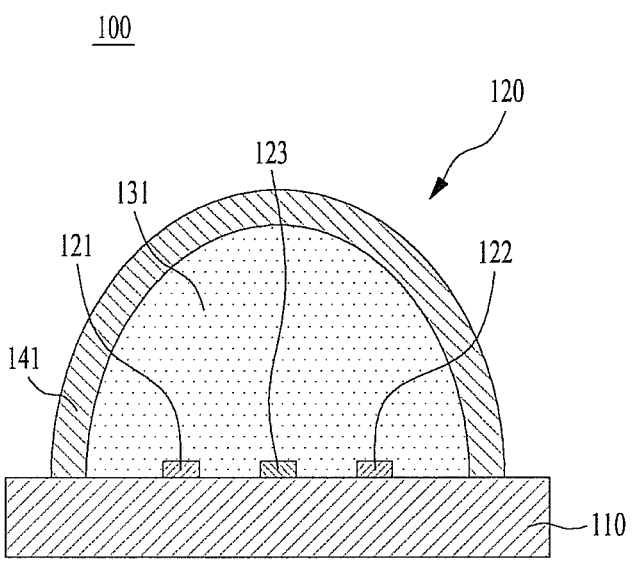
FIG. 6 is a sectional view showing a second embodiment of a light emitting device package.

FIG. 6 is a sectional view showing a second embodiment of a light emitting device package.

As exemplarily shown in FIG. 6, a lens 131 may be a non-spherical lens having a parabolic vertical cross section.

Provided over the lens 131 may be a wavelength conversion layer 141, which absorbs light emitted from the light emitting device 120 and emits light having a specific wavelength band.

The wavelength conversion layer 141 may have a constant thickness over the lens 131. That is, the wavelength conversion layer 141 may come into contact with the lens 131 such that an outer surface of the wavelength conversion layer 141 has the same curvature as the lens 131.

In this case, the thickness of the wavelength conversion layer 141 may be less than the thickness of the lens 131.

The wavelength conversion layer 141 may be a layer in which a fluorescent (phosphor) material is uniformly distributed.

A description of other not-described configurations may be replaced by the above description with reference to FIGS. 1 to 5.

Figure 7:
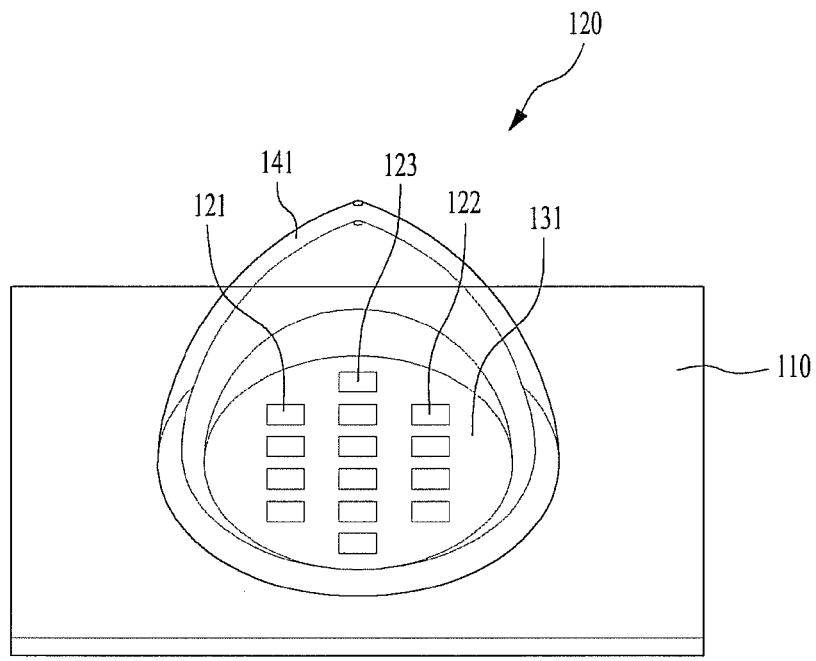
FIG. 7 is a perspective view showing the second embodiment of the light emitting device package.
Figure 8:
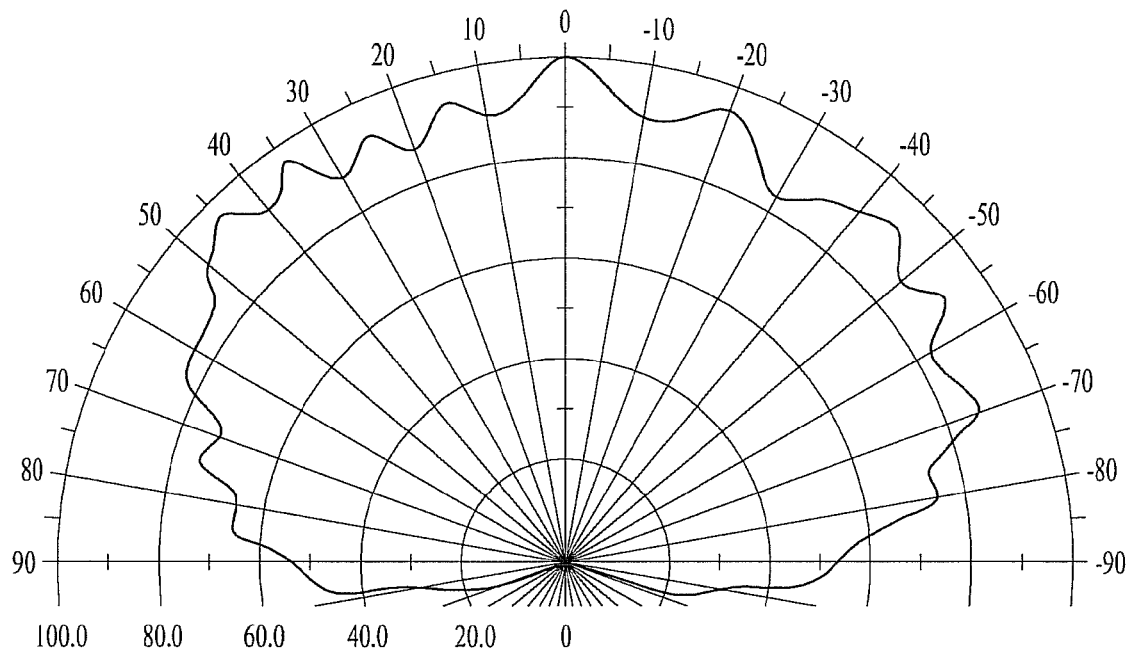
FIG. 8 is a graph showing light distribution of the light emitting device package according to the second embodiment.

FIG. 7 is a perspective view showing the above-described light emitting device package of FIG. 6, and FIG. 8 is a graph showing light distribution of the light emitting device package.

As exemplarily shown in FIG. 7, the first light emitting devices 121 and 122 and the second light emitting device 123, which are located symmetrically to each other, may ensure that light having passed through the lens 130 is extracted outward while exhibiting uniform distribution.

Output light of the light emitting device 120 having passed through the lens 131 is partially converted in wavelength while passing through the wavelength conversion layer 141 that is formed over the lens 131 by a constant thickness to cover the lens 131, which may ensure uniform mixing of light.

That is, as mentioned above, a part of blue light of the first light emitting devices 121 and 122 is converted into yellow light while passing through the wavelength conversion layer 141.

In this case, the first light emitting devices 121 and 122 are located symmetrically about the lens 131 and an adjacent surface of the wavelength conversion layer 141, which ensures a constant conversion rate of blue light without a great deviation depending on a position of the wavelength conversion layer 141.

Most red light emitted from the second light emitting device 123 directly passes through the lens 131 and the wavelength conversion layer 141.

As such, blue light, converted yellow light and red light may be uniformly mixed to generate high quality white light. In this case, red light may greatly enhance color rendition of white light.

The resulting white light may have light distribution as exemplarily shown in FIG. 8. That is, light emitted from the light emitting device package 100 may have light distribution, a viewing angle of which is greater than that in Lambertian distribution (see FIG. 5).

Figure 9:
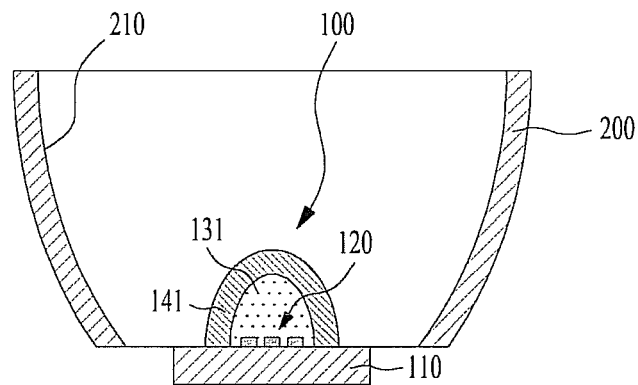
FIG. 9 is a schematic view showing relative positions of the light emitting device package and a first reflecting layer.

As exemplarily shown in FIG. 9, light of the light emitting device package 100 may be emitted upward from the reflecting surface 210 of a first reflecting layer 200.

More specifically, the first reflecting layer 200 has a slope tilted from the package main body 110 of the light emitting device package 100, which may allow light, emitted from the light emitting device package 100 that has light distribution over a greater viewing angle, to be reflected by and extracted outward from the reflecting surface 210 of the first reflecting layer 200.

The reflecting surface 210 may be tapered with decreasing distance from the package main body 110 on which the light emitting device 120 of the light emitting device package 100 is mounted.

In the case in which the light emitting device package 100 has light distribution over a small viewing angle, the size of the first reflecting layer 200 may increase, which causes structural limitations.

Accordingly, wider light distribution than Lamertian distribution is more efficient with regard to design of the first reflecting layer 200 to ensure effective emission of light through the first reflecting layer 200.

This is because the first reflecting layer 200 is shaped to surround the light emitting device package 100, and therefore it is possible to achieve desired light distribution by adjusting an optical path of light reflected by the reflecting surface 210 of the first reflecting layer 200 as the quantity of light emitted from the lateral side of the light emitting device package 100 increases.

In this way, effective light distribution may be accomplished using the lens 131 having a parabolic vertical cross section as exemplarily shown in FIGS. 6 and 7.

Figure 10:
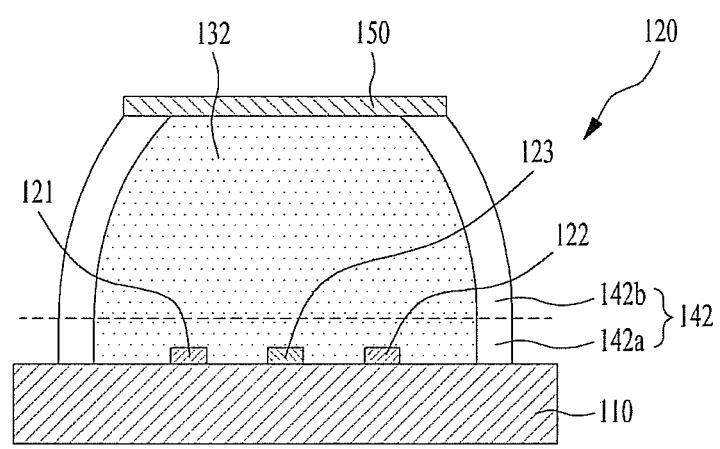
FIG. 10 is a sectional view showing a third embodiment of a light emitting device package.
Figure 11:
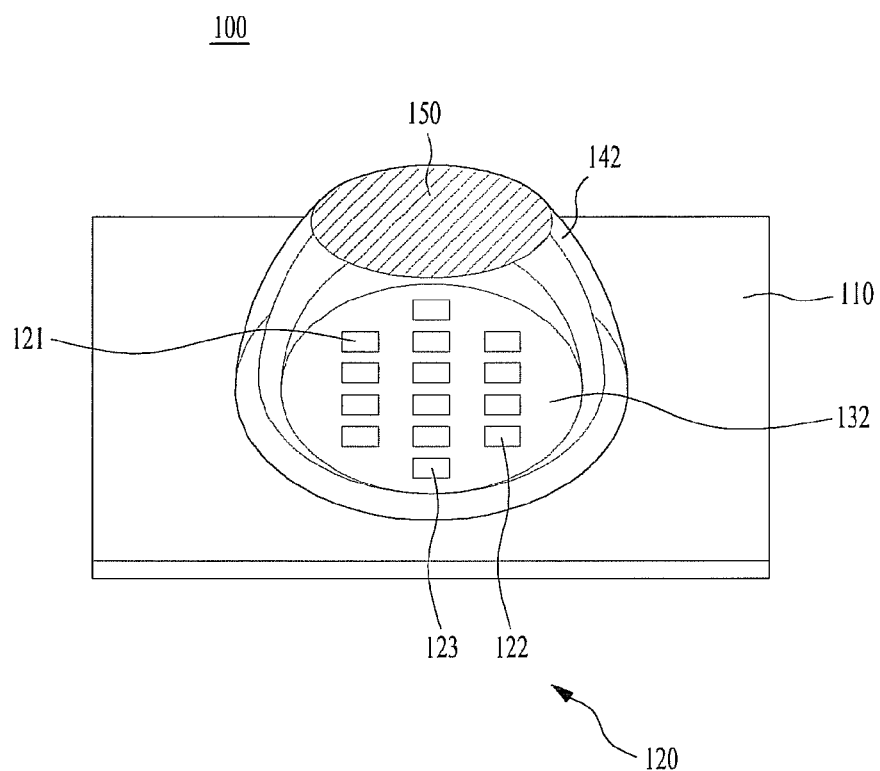
FIG. 11 is a perspective view showing the third embodiment of the light emitting device package.

FIG. 10 is a sectional view showing a third embodiment of a light emitting device package, and FIG. 11 is a perspective view showing the third embodiment of the light emitting device package.

To accomplish the above-described wide light distribution, as exemplarily shown in FIG. 10, a lens 132 having an elliptical vertical cross section may be used.

A wavelength conversion layer 142 may be disposed over the lens 132 by a constant thickness. The wavelength conversion layer 142 may include a first surface 142*a* substantially not having a curvilinear vertical cross section and a second surface 142*b* having a curvilinear vertical cross section.

A second reflecting layer 150 may be disposed over the wavelength conversion layer 142.

The second reflecting layer 150 may reflect light emitted from the light emitting device 120 to increase the quantity of light emitted outward from the package 100.

In particular, light distribution may be effectively widened as light centrally concentrated about the package main body 110 is mainly reflected by the second reflecting layer 150.

In this case, the wavelength conversion layer 142 may cover only a part of the lens 132 to expose the lens 132 upward. As such, an upper surface of the lens 132 may come into contact with the second reflecting layer 150.

Figure 12:
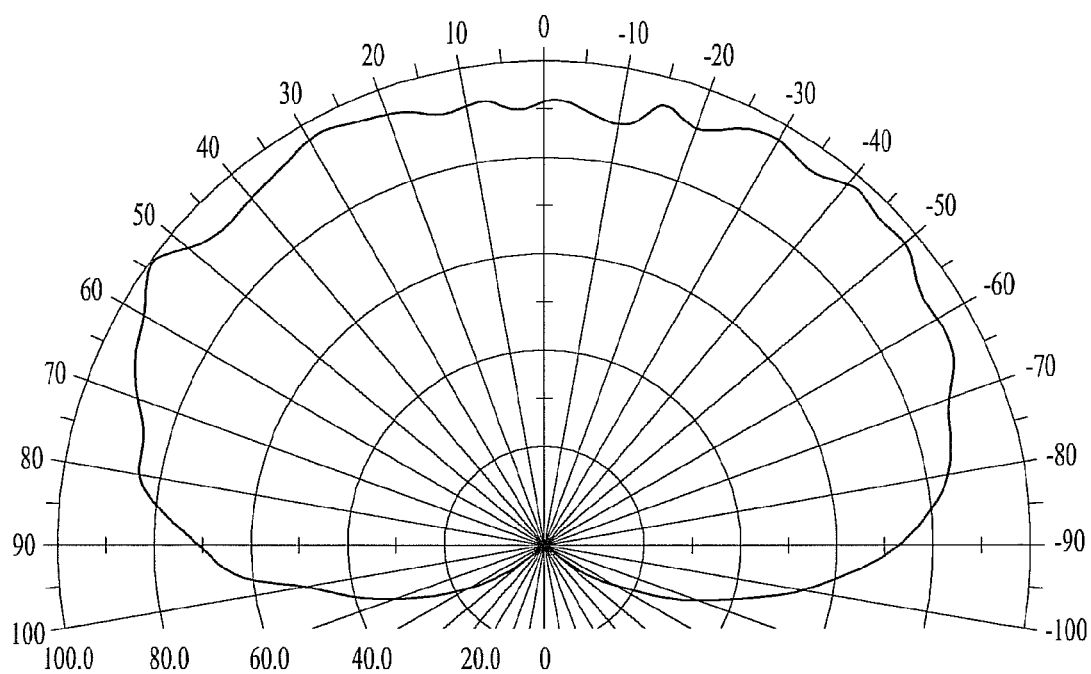
FIG. 12 is a graph showing light distribution of the light emitting device package according to the third embodiment.

FIG. 12 schematically shows light distribution of the light emitting device package. It will be appreciated that wider light distribution than that in the embodiment of FIG. 6 is accomplished.

Accordingly, it is possible to accomplish desired light distribution by adjusting the optical path of light reflected via the light emitting device package 100 having the aforementioned light distribution and the reflecting surface 210 of the first reflecting layer 200.

A description of other not-described configurations may be replaced by the above description with reference to FIGS. 1 to 8.

Figure 13:
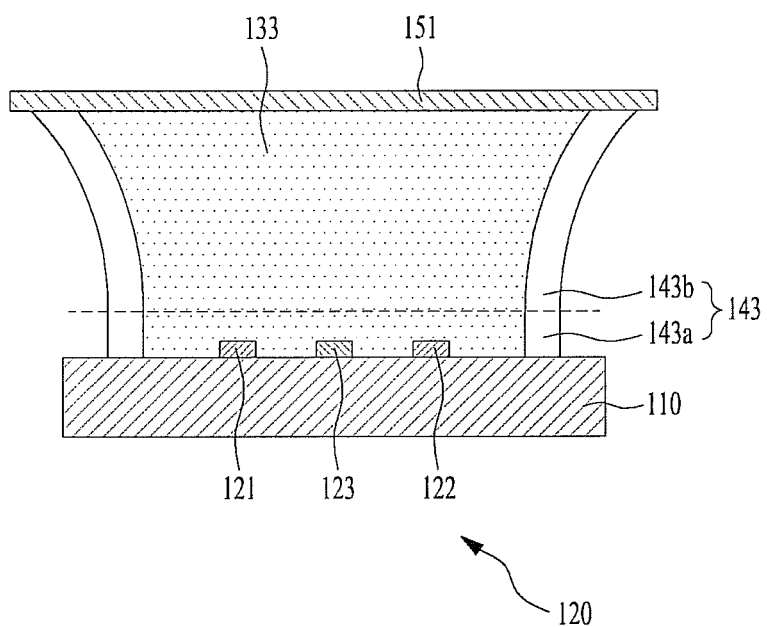
FIG. 13 is a sectional view showing a fourth embodiment of a light emitting device package.

FIG. 13 is a sectional view showing a fourth embodiment of a light emitting device package.

To accomplish the above-described wide light distribution, as exemplarily shown in FIG. 13, a lens 133 may be configured such that a vertical cross sectional area of the lens 133 gradually increases upward.

That is, the vertical cross sectional area of the lens 133 may increase with increasing distance from the light emitting device 120. The vertical cross section may be a segment of a hyperbola.

In this case, a wavelength conversion layer 143 having a constant thickness may be provided at a lateral surface of the lens 133.

The wavelength conversion layer 143 may include a first surface 143a substantially not having a curvilinear vertical cross section and a second surface 143b having an outwardly bent curvilinear vertical cross section.

A second reflecting layer 151 may be disposed over the lens 133 and the wavelength conversion layer 143 to reflect light emitted from the light emitting device 120, which may increase the quantity of light emitted outward from the package 100.

Figure 14:
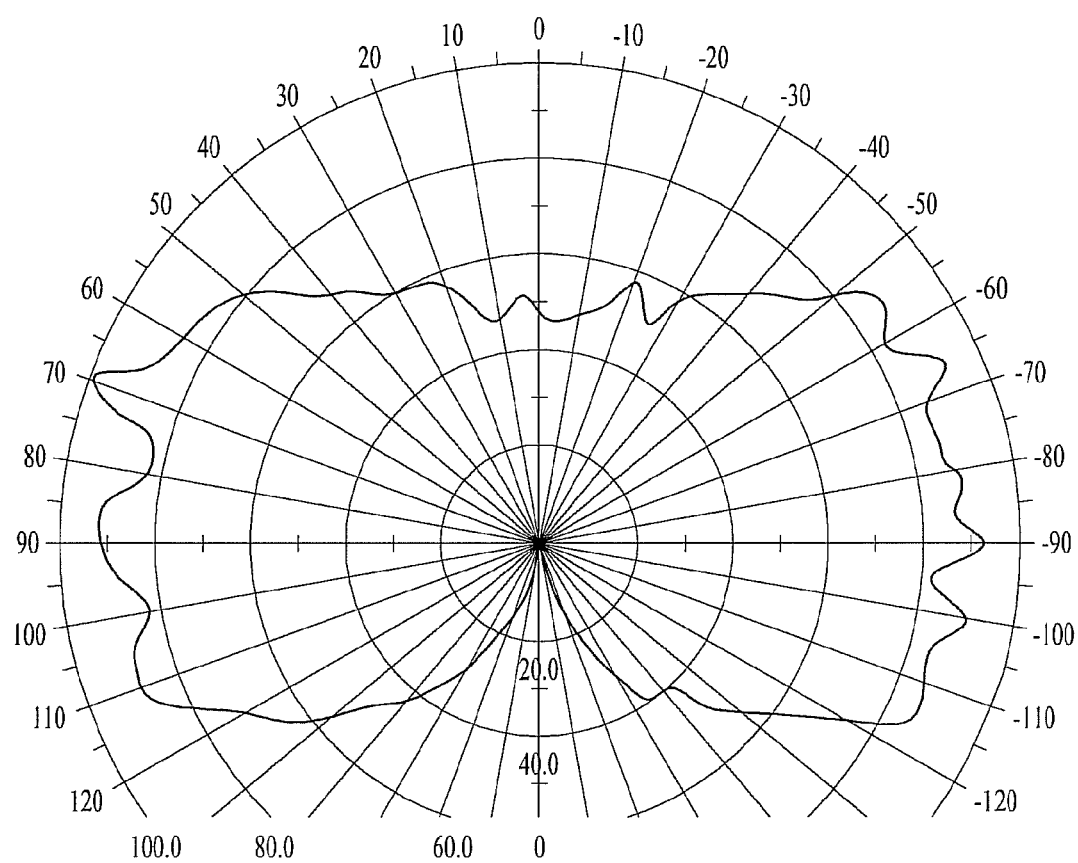
FIG. 14 is a graph showing light distribution of the light emitting device package according to the fourth embodiment.

In this case, the second reflecting layer 151 may have a greater area than that in the embodiment as described above with reference to FIG. 10, thereby accomplishing wider light distribution as exemplarily shown in FIG. 14.

That is, a width of the second reflecting layer 151 may be greater than a width of the wavelength conversion layer 143.

As exemplarily shown in FIG. 14, a great quantity of light emitted from the light emitting device package 100 may be distributed rearward of the surface of the package 100 on which the light emitting device 120 is mounted. In this case, the light may be reflected forward from the upper surface of the package main body 110 equipped with the light emitting device 120.

A description of other not-described configurations may be replaced by the above description with reference to FIGS. 1 to 12.

Meanwhile, a lighting apparatus may be fabricated using the light emitting device package 100.

Hereinafter, the lighting apparatus using the light emitting device package 100 will be described with reference to FIGS. 15 and 16.

Figure 15:
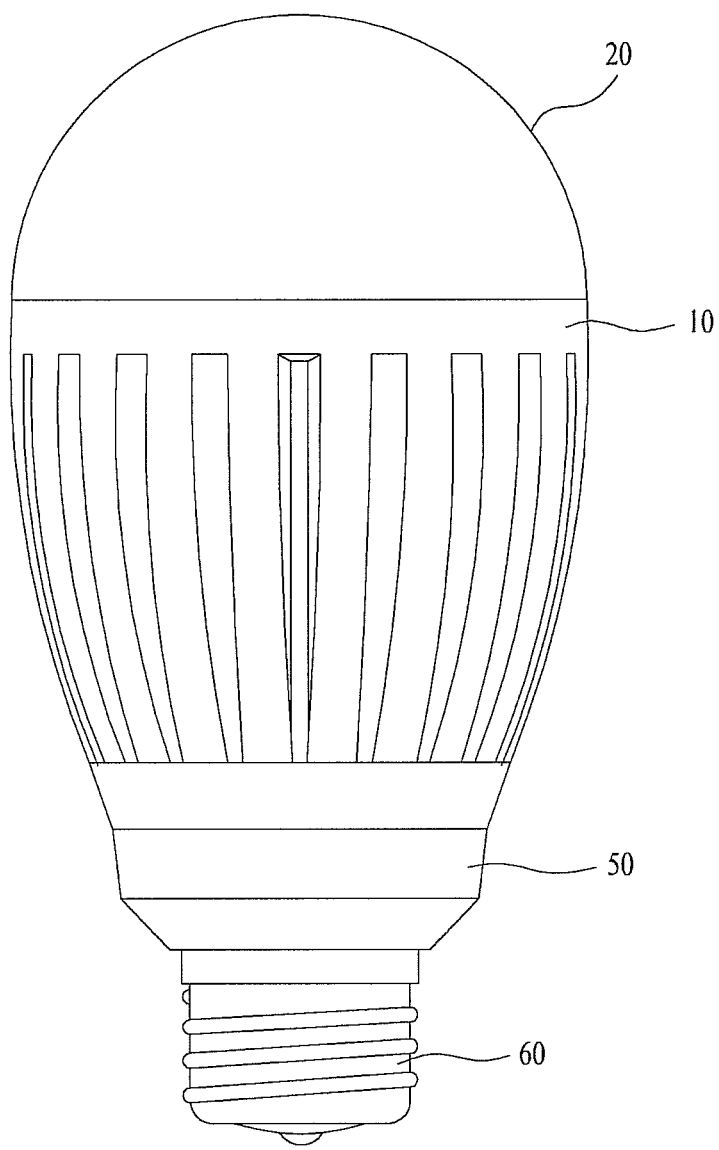
FIG. 15 is a perspective view showing one embodiment of a lighting apparatus using a light emitting device package.
Figure 16:
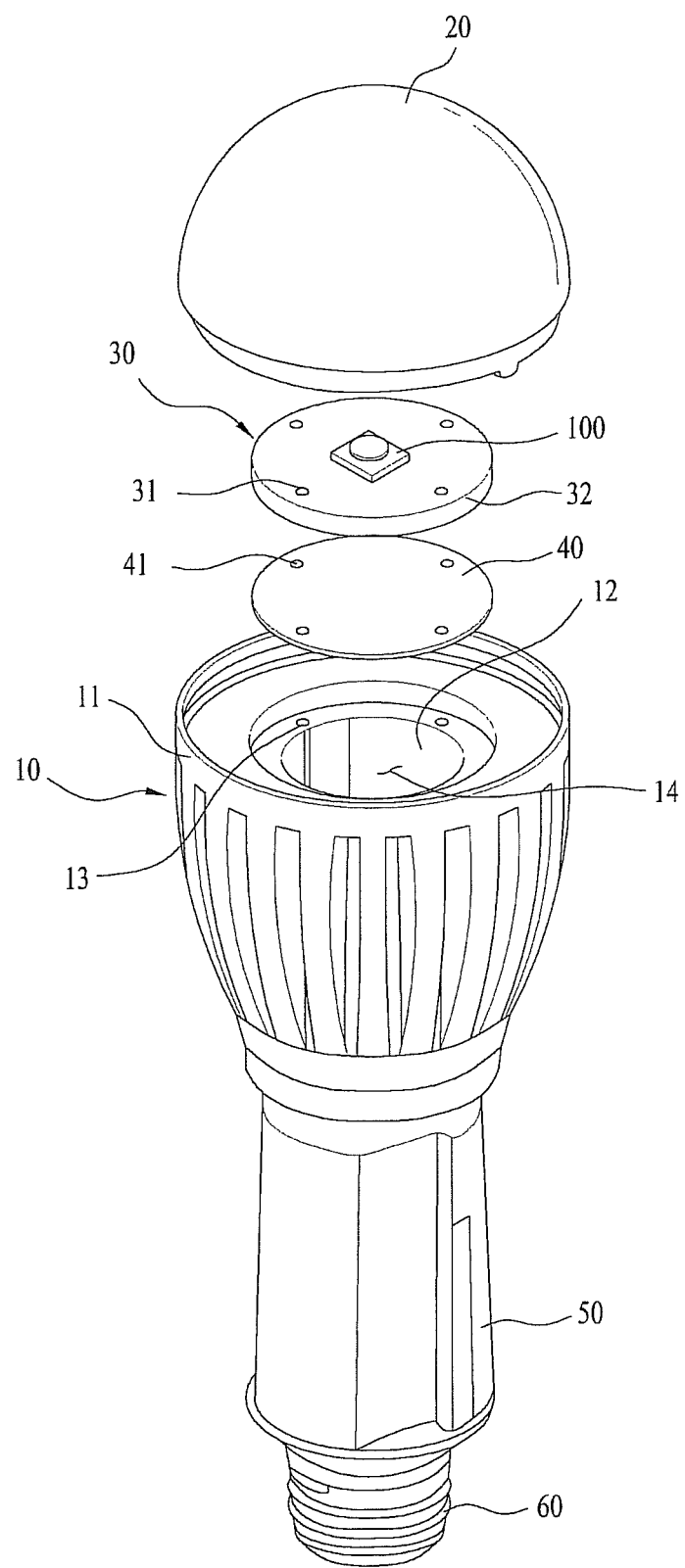
FIG. 16 is an exploded perspective view of the lighting apparatus using the light emitting device package according to one embodiment.

FIG. 15 is a perspective view showing one embodiment of a lighting apparatus, and FIG. 16 is an exploded perspective view of the lighting apparatus according to one embodiment.

As exemplarily shown in FIGS. 15 and 16, the lighting apparatus includes a heat sink 10, a lens unit 20, a light emitting unit 30, an electric device (not shown), a case 50, and a power socket 60.

The heat sink 10 defines an external appearance of the lighting apparatus. The heat sink 10 may include an outer housing 11 having a hollowed region 14 and an inner housing 12 placed in the hollowed region 14 to extend in a longitudinal direction thereof.

The outer housing 11 may be formed of a highly thermally conductive lightweight material to outwardly radiate heat generated from the light emitting unit 30 during operation of the lighting apparatus. The outer housing 11 may be formed of a resin material.

The hollowed region 14 longitudinally penetrates the outer housing 11. For example, the hollowed region 14 may have a cylindrical shape. The inner housing 12, the electric device, and the case 50, for example, may be inserted into the hollowed region 14.

The inner housing 12 is placed in the hollowed region 14 of the outer housing 11. The inner housing 12 may be provided with a plurality of fins protruding toward the outer housing 11. These fins may increase a surface area of the inner housing 12 as well as a contact area between the inner housing 12 and the outer housing 11, thereby enhancing heat radiation efficiency.

Accordingly, as light generated from the light emitting unit 30 is transferred to the inner housing 12, and in turn the heat transferred to the inner housing 12 is radiated outward through the outer housing 11, heat radiation of the lighting apparatus is accomplished.

The lens unit 20 is mounted in the outer housing 11. The lens unit 20 functions to outwardly guide light emitted from the light emitting unit 30 mounted in the outer housing 11. The lens unit 20 may include at least one condenser lens.

To accomplish enhanced light emission efficiency by diffusing light emitted from the light emitting unit 30, the lens unit 20 may be fabricated by molding a bulb-shaped diffuser formed of resin, such as polycarbonate or acryl.

The light emitting unit 30 includes a substrate 32 and the light emitting device package 100 mounted on the substrate 32. For example, the light emitting device package 100 may be attached to a printed circuit board via Surface Mounting Technology (SMT).

The light emitting device package 100 may be acquired as described above. Details of the light emitting device package 100 are equal to the above description with reference to FIGS. 1 to 14, and thus a detailed description thereof will be omitted hereinafter.

Alternatively, the light emitting unit 30 may be mounted in the inner housing 12. That is, the substrate 32 of the light emitting unit 30 may be fastened to the inner housing 12. To this end, the lighting apparatus may further include fasteners (not shown) that penetrate the substrate 32 of the light emitting unit 30 to thereby be secured to the inner housing 12.

The fasteners may be screws. The substrate 32 may have first fastening holes 31 perforated from one surface of the light emitting unit 30, on which the light emitting device package 100 is mounted, to an opposite surface of the light emitting unit 30. The inner housing 12 may have second fastening holes 13 at positions corresponding to the first fastening holes 31.

The lighting apparatus may further include a thermal conduction pad 40 interposed between the light emitting unit 30 and the inner housing 12. In this case, the thermal conduction pad 40 may have third fastening holes 41 at positions corresponding to the first fastening holes 31 of the substrate 32 and the second fastening holes 13 of the inner housing 12. Accordingly, in the above-described configuration, the light emitting unit 30 and the thermal conduction pad 40 may be secured to the inner housing 12 by the aforementioned fasteners.

Accordingly, the thermal conduction pad 40 may enhance heat transfer performance between the light emitting unit 30 and the inner housing 12 and may increase a contact area between the light emitting unit 30 and the inner housing 12, thereby achieving enhanced heat radiation efficiency.

The electric device (not shown) is placed in the hollowed region 14 of the outer housing 11 and is electrically connected to the light emitting unit 30. The electric device may include a circuit that supplies power to the light emitting unit 30 and is electrically connected to the light emitting unit 30, and an insulator charged in a space between the circuit and the case 50 to insulate the circuit.

The circuit may include a drive circuit having a controller to change current to be applied to each light emitting diode. For example, current change may be implemented via Pulse Width Modulation (PWM) control.

The insulator charged in the space between the circuit and the case 50 may be formed of silicon.

The case 50 encloses the electric device and is inserted into the hollowed region 14 of the outer housing 11. For example, the case 50 may be inserted into the hollowed region 14 of the outer housing 11 such that a partial region of the case 50 is located inside the inner housing 12.

The case 50 and the hollowed region 14 of the outer housing 11 may be provided with structures for easy insertion of the case 50. In one example, a guide protrusion (not shown) may be provided at an outer circumferential surface of the case 50 and a guide groove (not shown) for guidance of the guide protrusion of the case 50 may be formed in an inner circumferential surface of the hollowed region 14 of the outer housing 11.

The power socket 60 may be mounted in the case 50.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
    a light emitting device located on a package main body, the light emitting device including a first light emitting device configured to emit light having a first wavelength band and a second light emitting device configured to emit light having a second wavelength band;
    a lens disposed over the light emitting device; and
    a wavelength conversion layer disposed over the lens, the wavelength conversion layer serving to absorb light having the first wavelength band or the second wavelength band so as to emit light having a third wavelength band, wherein the wavelength conversion layer includes a first portion substantially having a linear vertical cross section and a second portion having a curvilinear vertical cross section, wherein an area of the second portion is substantially larger than an area of the first portion, wherein a reflecting layer is provided on an edge of the second portion, and
    wherein the wavelength conversion layer has an opening, and the reflecting layer is provided over the opening.

2. The package according to claim 1, wherein the lens is a spherical lens.

3. The package according to claim 1, wherein the wavelength conversion layer has a constant thickness over the lens.

4. The package according to claim 1, wherein the first light emitting device and the second light emitting device respectively include a plurality of light emitting devices configured to emit light having substantially the same wavelength band.

5. The package according to claim 4, wherein the first light emitting device and the second light emitting device are located symmetrically to each other.

6. The package according to claim 5, wherein the second light emitting device is located at the center of the package main body, and the first light emitting device is located at either side of the second light emitting device.

7. The package according to claim 1, wherein the wavelength conversion layer is configured to output yellow light.

8. The package according to claim 1, wherein the first wavelength band is a blue light band and the second wavelength band is a red light band.

9. The package according to claim 1, wherein a main wavelength of the first wavelength band is 450 nm, a main wavelength of the second wavelength band is 615 nm, and a main wavelength of the wavelength conversion layer is 555 nm.

10. A light emitting device package comprising:
    a light emitting device located on a package main body, the light emitting device including a first light emitting device configured to emit light having a first wavelength band and a second light emitting device configured to emit light having a second wavelength band;
    a lens disposed over the light emitting device, wherein the lens has a shape, an area of which increases with increasing distance from the light emitting device such that the lens has a first side relatively close to the light emitting device and a second side relatively far from the light emitting device, and wherein an area of the second side is substantially larger than an area of the first side;
    a wavelength conversion layer disposed over the lens, the wavelength conversion layer serving to absorb light having the first wavelength band or the second wavelength band to emit light having a third wavelength band;
    a first reflecting layer outwardly spaced apart from the wavelength conversion layer, the first reflecting layer serving to reflect light emitted from the light emitting device and the wavelength conversion layer so as to outwardly emit light from the package; and a second reflecting layer provided on the second side of the lens, wherein the wavelength conversion layer has an opening, and the second reflecting layer is provided over the opening.

11. The package according to claim 10, wherein the lens is configured to allow light, emitted from the light emitting device, to be distributed such that a viewing angle of light is greater than that in Lambertian light.

12. The package according to claim 10, wherein the second reflecting layer contacts the wavelength conversion layer.

13. The package according to claim 12, wherein the second reflecting layer is located parallel to a surface of the package main body on which the light emitting device is located.

14. The package according to claim 10, wherein the wavelength conversion layer has a constant thickness over the lens.

15. The package according to claim 10, wherein the first light emitting device and the second light emitting device respectively include a plurality of light emitting devices configured to emit light having substantially the same wavelength band.

16. The package according to claim 15, wherein the first light emitting device and the second light emitting device are located symmetrically to each other.

17. The package according to claim 16, wherein the second light emitting device is located at the center of the package main body, and the first light emitting device is located at either side of the second light emitting device.

18. The package according to claim 10, wherein the first wavelength band is a blue light band and the second wavelength band is a red light band.

19. The package according to claim 10, wherein the wavelength conversion layer includes a first portion substantially having a linear vertical cross section and a second portion having a curvilinear vertical cross section.

20. The package according to claim 19, wherein the second reflecting layer is on the second portion.

* * * * *